US012390872B2

(12) United States Patent
Choi et al.

(10) Patent No.: US 12,390,872 B2
(45) Date of Patent: Aug. 19, 2025

(54) LASER BONDING APPARATUS FOR THREE-DIMENSIONAL MOLDED SCULPTURES

(71) Applicant: LASERSSEL CO., LTD., Asan-si (KR)

(72) Inventors: Jae Joon Choi, Gwangju-si (KR); Byung Rock Kim, Incheon (KR)

(73) Assignee: LASERSSEL CO., LTD., Asan-si (KR)

( * ) Notice: Subject to any disclaimer, the term of this patent is extended or adjusted under 35 U.S.C. 154(b) by 119 days.

(21) Appl. No.: 18/377,450

(22) Filed: Oct. 6, 2023

(65) Prior Publication Data

US 2024/0033840 A1 Feb. 1, 2024

Related U.S. Application Data

(62) Division of application No. 16/921,339, filed on Jul. 6, 2020, now Pat. No. 11,813,688, which is a division
(Continued)

(51) Int. Cl.
*B23K 1/005* (2006.01)
*B23K 3/08* (2006.01)
(Continued)

(52) U.S. Cl.
CPC ............. *B23K 1/0056* (2013.01); *B23K 3/08* (2013.01); *B23K 3/087* (2013.01);
(Continued)

(58) Field of Classification Search
CPC ........ B23K 1/0056; B23K 3/08; B23K 3/087; B23K 26/0823; B23K 35/025;
(Continued)

(56) References Cited

U.S. PATENT DOCUMENTS 5,188,280 A * 2/1993 Nakao ................... H01L 24/81
228/123.1
7,774,929 B2 8/2010 Jacobs
(Continued)

FOREIGN PATENT DOCUMENTS

JP 3303832 B2 7/2002
JP 4409136 B2 2/2010
(Continued)

OTHER PUBLICATIONS

International Search Report dated Sep. 4, 2017, issued in corresponding International Application No. PCT/KR2017/006584.
(Continued)

*Primary Examiner* — Eduardo A Rodela
(74) *Attorney, Agent, or Firm* — Hauptman Ham, LLP (57) ABSTRACT

Disclosed are a laser bonding apparatus and a laser bonding method capable of bonding an electronic component to a three-dimensional structure having a regular or irregular shape in a curved portion such as an automobile tail lamp or a headlamp. The laser bonding apparatus and method for a three-dimensional structure may prevent misalignment and poor bonding of the electronic component with respect to the three-dimensional structure.

6 Claims, 6 Drawing Sheets

Related U.S. Application Data of application No. 15/577,859, filed as application No. PCT/KR2017/006584 on Jun. 22, 2017, now Pat. No. 10,748,773.

(51) Int. Cl.
| | |
|---|---|
| *B23K 26/08* | (2014.01) |
| *B23K 35/02* | (2006.01) |
| *H01L 21/268* | (2006.01) |
| *H01L 21/52* | (2006.01) |
| *H01L 21/677* | (2006.01) |
| *H01L 23/00* | (2006.01) |
| *H05K 13/04* | (2006.01) |
| *H01L 21/60* | (2006.01) |

(52) U.S. Cl.
CPC ........ *B23K 26/0823* (2013.01); *B23K 35/025* (2013.01); *H01L 21/268* (2013.01); *H01L 21/52* (2013.01); *H01L 21/67721* (2013.01); *H01L 21/6773* (2013.01); *H01L 24/04* (2013.01); *H01L 24/741* (2013.01); *H01L 24/75* (2013.01); *H01L 24/81* (2013.01); *H05K 13/0465* (2013.01); *H05K 13/0469* (2013.01); *H01L 2021/60112* (2013.01); *H01L 2021/60292* (2013.01); *H01L 2224/75261* (2013.01); *H01L 2224/75651* (2013.01)

(58) Field of Classification Search
CPC ...... B23K 1/0016; B23K 1/20; B23K 26/082; B23K 37/047; H01L 21/268; H01L 21/52; H01L 21/67721; H01L 21/6773; H01L 24/04; H01L 24/741; H01L 24/75; H01L 24/81; H01L 2021/60112; H01L 2021/60292; H01L 2224/75261; H01L 2224/75651; H01L 2224/75263; H01L 2224/7598; H01L 2224/75983; H01L 21/67115; H01L 21/67333; H01L 21/677; H01L 21/681; H01L 24/83; H01L 2224/75611; H01L 2224/75753; H01L 2224/75804; H01L 2224/75824; H01L 2224/83224; H01L 2224/83815; H01L 2224/83862; H01L 2224/97; H01L 2924/15156; H01L 2924/15159; H01L 2924/3512; H01L 24/82; H05K 13/0465; H05K 13/0469; H05K 13/046; H10H 20/036; F21S 41/151; F21S 41/192; F21S 43/14; F21S 43/15; F21S 43/195

See application file for complete search history.

(56) References Cited

U.S. PATENT DOCUMENTS

| | | | |
|---|---|---|---|
| 11,213,913 | B2 | 1/2022 | Choi et al. |
| 11,257,783 | B2 * | 2/2022 | Kim ........................ H01L 24/83 |
| 2011/0038150 | A1 | 2/2011 | Woodgate et al. |
| 2011/0309057 | A1 | 12/2011 | Lin |
| 2016/0004938 | A1 | 1/2016 | Sasaki |
| 2018/0233496 | A1 | 8/2018 | Yoo et al. |
| 2019/0067235 | A1 | 2/2019 | Choi et al. |

FOREIGN PATENT DOCUMENTS

| | | | |
|---|---|---|---|
| JP | 2011-216503 | A | 10/2011 |
| JP | 2012-227293 | A | 11/2012 |
| JP | 2013-197273 | A | 9/2013 |
| JP | 2015-527935 | A | 9/2015 |
| KR | 10-2006-0085523 | A | 7/2006 |
| KR | 10-0638824 | B1 | 10/2006 |
| KR | 10-0913579 | B1 | 8/2009 |
| KR | 10-2011-0108128 | A | 10/2011 |
| KR | 10-2012-0106051 | A | 9/2012 |
| KR | 10-1280605 | A | 7/2013 |
| KR | 10-2014-0012812 | A | 2/2014 |

OTHER PUBLICATIONS

Japanese Office Action mailed on Dec. 11, 2018, in connection with the Japanese Patent Application No. 2017-562751.

* cited by examiner

LASER BONDING APPARATUS FOR THREE-DIMENSIONAL MOLDED SCULPTURES

CROSS REFERENCE TO RELATED APPLICATION

This application is a Divisional Application of U.S. application Ser. No. 16/921,339 filed on Jul. 6, 2020, which is a Divisional Application of U.S. application Ser. No. 15/577,859 filed Nov. 29, 2017 which is a national stage filing under U.S.C § 371 of PCT application number PCT/KR2017/006584 filed on Jun. 22, 2017 which is based upon and claims the benefit of priority to Korean Patent Application No. 10-2016-0136477 filed on Oct. 20, 2016 in the Korean Intellectual Property Office. The disclosures of the above-listed applications are hereby incorporated by reference herein in their entireties.

TECHNICAL FIELD

The present invention relates to a laser bonding technique, and more particularly, to a laser bonding apparatus and a bonding method capable of bonding a semiconductor wafer to a three-dimensional structure having a regular or irregular shape in a curved portion such as an automobile tail lamp or a headlamp.

BACKGROUND

A laser bonding is preferred to the conventional wire bonding since the electronic devices become smaller and more sophisticated and the semiconductor packaging technology for protecting semiconductor chips from various external environments such as dust, moisture or electrical/mechanical loads has encountered limitations in making the devices lighter, thinner and smaller by the conventional wire bonding method. The laser bonding is a method in which a semiconductor chip is attached to a circuit pattern on a circuit board or a circuit tape and is bonded using a laser.

Japanese Patent Registration No. 3303832 discloses a laser bonding technique for collectively connecting each electrode of a semiconductor chip to a substrate. According to Japanese Patent No. 3303832, an adsorption head for adsorbing a semiconductor chip is made of glass through which a laser beam is transmitted, and a Peltier element is coupled to the stage. The semiconductor chip is rapidly heated by directly heating the entire semiconductor chip by the laser beam. The substrate is rapidly heated and cooled by the Peltier element coupled to the stage.

U.S. Patent Publication No. 2016/004938 relates to semiconductor chip packaging, and discloses a bonding technique using a laser for connecting a semiconductor chip die to a circuit board. According to U.S. Patent Publication No. 2016/004938, a bump reflow step is disclosed in which a laser beam is directed toward a semiconductor die to volatilize flux and electrically connect a bump to a circuit pattern.

In Korean Patent No. 10-0913579, a device for bonding a driving circuit board such as FPC (Flexible Printed Circuit), TCP (Tape Carrier Package), CBF (Common Block Flexible Printed Circuit), Driver IC (Driver Integrated Circuit) is disclosed. According to Korean Patent No. 10-0913579, a board to be bonded with a driving circuit board is transferred to and from a bonding operation position to be bonded with the driving circuit board, thereby reducing a tact time and speeding up the operation.

In general, a reflow apparatus is used for attaching a device including an electronic component such as a semiconductor chip or integrated circuit (IC), a transistor (TR), a resistance element (R), and a capacitor (C) to a printed circuit board. Currently, the reflow apparatus may be classified into mass reflow type and laser reflow type.

A mass reflow apparatus mounts a plurality of substrates with solder material such as solder balls, solder pads, or solder paste on the conveyor belt and drives the conveyor belt. The substrate is passed along the conveyor belt through a heating zone equipped with an infrared or ceramic heater. The infrared heaters are provided on the upper and lower sides of the conveyor belt to apply heat to the solder material on the substrate to attach the semiconductor elements thereto.

According to the mass reflow apparatus, the electronic component or device is subject to thermal stress for about 210 seconds at a high temperature of about 50° C. or up to 230 to 290° C. Accordingly, there is a problem that the electronic component or device may be damaged by heat, thereby deteriorating the characteristics or lifetime of the electronic component or device. In addition, there is a problem that it takes a long time of about 3 to 10 minutes for the infrared heater to heat the solder material to bond the electronic component or device to the substrate, which is not economical. In addition, the mass reflow process may cause defects by applying heat to all components on the substrate including the ones that are susceptible to heat, and cause thermal deformation on the overall substrate since heat is applied to the entire substrate.

Meanwhile, automotive headlights have recently been replaced by LEDs. The structures of the substrate for LED headlight vary from two-dimensional to three-dimensional shapes. In the case of an irregular substrate such as a step-shaped or a bowl-shaped substrate on which the LED is mounted, when the LED is bonded to the irregular substrate through the mass reflow process the heat energy is unevenly distributed on the substrate to cause bonding defects, and thermal energy is applied to the substrate as a whole thereby increasing the possibility that thermal deformation may occur throughout the entire substrate.

In addition to automobile headlights, it is difficult to avoid disadvantages of the mass reflow process when the shape of the substrate for bonding semiconductor chips is three-dimensional or irregular.

Therefore, when the substrate is three-dimensional or irregular a laser reflow technique can be a very useful solution. The laser reflow technique is capable of irradiating a homogenized laser beam for each bonding site and easily adjusting each irradiation region of the laser beam.

Nevertheless, the laser reflow technique so far has only been applied to substrates having a generally planar shape, such as PCBs and glass substrates used in devices such as mobile phones and TVs. If the substrate is not provided in a planar form, or if the locations where the semiconductor element is attached are totally irregular, the conventional laser bonding apparatus cannot operate on such substrate.

Figure 1:
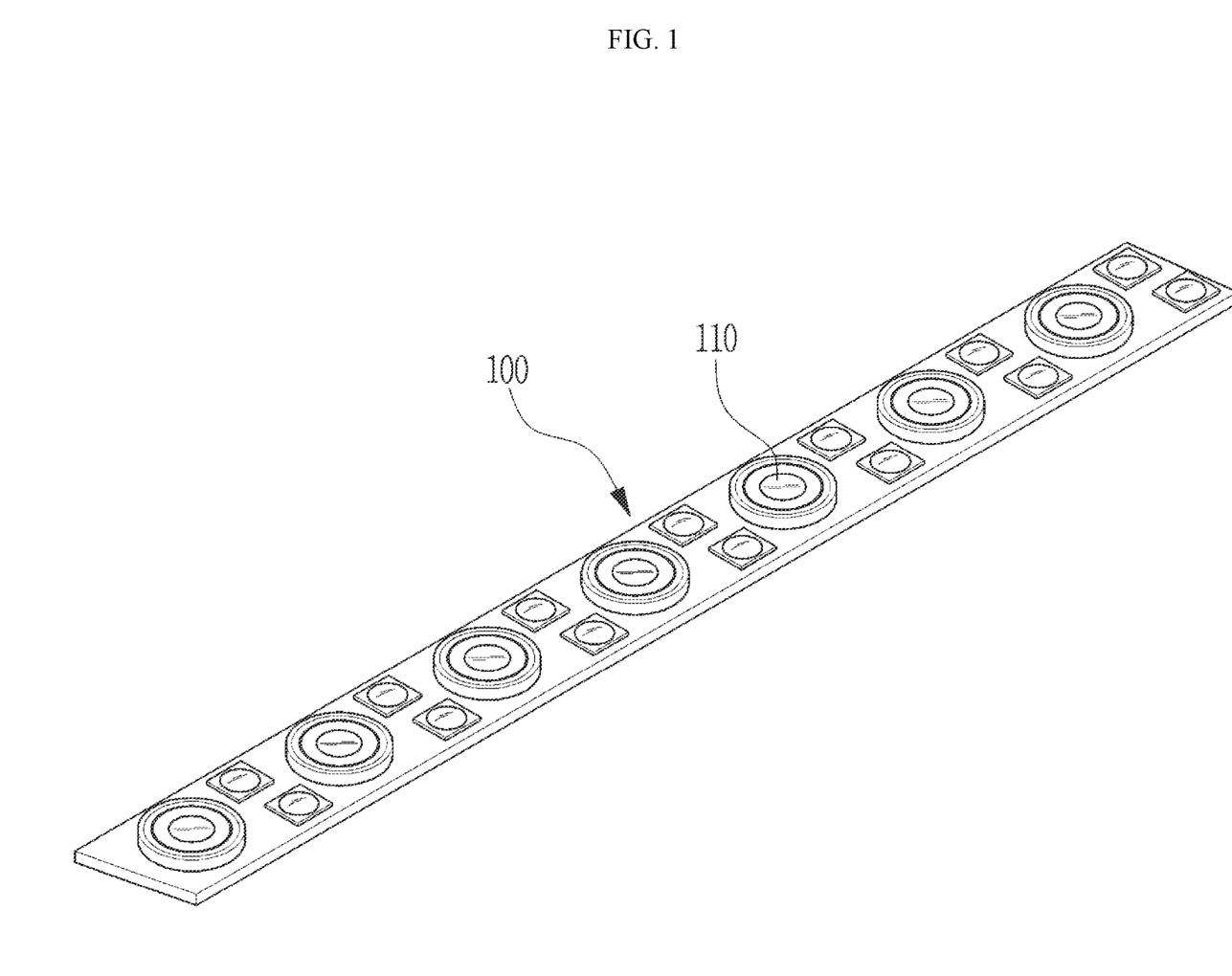
FIG. 1 is an exemplary view for explaining a three-dimensional structure.

Accordingly, there is a need for a new laser bonding apparatus and method that can effectively bond electronic components or elements to any shape of three-dimensional structures including automotive tail lamps or headlamps as shown in FIG. 1.

SUMMARY

Technical Problem

It is an object of the present invention to provide a laser bonding apparatus and method for a three-dimensional structure capable of bonding electronic elements to any type of three-dimensional structure. The present invention may apply not only to a substrate having a planar shape such as a flat PCB substrate and a glass substrate but also to a three-dimensional substrate including a curved portion of a regular or irregular shape.

Another object of the present invention is to provide a laser bonding apparatus and method for a three-dimensional structure that can prevent misalignment of a three-dimensional structure with respect to an electronic component and a bonding failure caused thereby.

Other objects of the present invention will become readily apparent from the following description of the embodiments.

Technical Solution

According to some embodiments, a laser bonding apparatus for three-dimensional structures comprises: a three-dimensional structure providing unit for providing a plurality of three-dimensional structures to which adhesives are applied and electronic components are attached, and a laser boding unit for bonding the electronic components to the three-dimensional structures by irradiating a laser beam to the electronic components attached to the three-dimensional structures.

According to some embodiments, a laser bonding apparatus for three-dimensional structures comprises: an electronic component providing unit for mounting and transporting a plurality of electronic components, a three-dimensional structure providing unit for supporting and conveying a plurality of three-dimensional structures, an adhesive material applying unit for applying adhesive material to one of the three-dimensional structures, an electronic component attaching unit for attaching an electronic component to the three-dimensional structure on which the adhesive material is applied, and a laser bonding unit for bonding the electronic component to the three-dimensional structure by irradiating a laser beam to the electronic component attached to the three-dimensional structure.

In the above embodiments, the three-dimensional structure have a curved portion with regular or irregular shape. Specifically the three-dimensional structure is a structure for an automobile tail lamp or an automobile headlamp.

According to some embodiments, a laser bonding method for a three-dimensional structure comprises the steps of: mounting a plurality of three-dimensional structures to a working table; conveying the working table on which the three-dimensional structures are mounted by a working table conveying unit; applying adhesive material to one of the three-dimensional structures; picking up and attaching an electronic component to the three-dimensional structure on which the adhesive material is applied; and bonding the electronic component to the three-dimensional structure by irradiating a laser beam to the electronic component attached to the three-dimensional structure. The adhesive material is solder paste or NCP and the three-dimensional structure is a structure for an automobile tail lamp or an automobile headlamp.

Effects of the Invention

The laser bonding apparatus for a three-dimensional structure according to the present invention provides the following effects.

First, it is possible to laser bond an electronic component to a three-dimensional structure including a curved portion of a regular or irregular shape.

Second, it is possible to prevent misalignment of a three-dimensional structure with respect to an electronic component and bonding failure caused thereby, as well as to prevent defective application of an adhesive material and poor adhesion of the electronic component to the three-dimensional structure.

It should be understood that the effects of the present invention are not limited to the effects described above, but include all effects that can be induced from the details of specification or the configuration of the invention described in the claims.

DESCRIPTION OF EMBODIMENTS

Hereinafter, the present invention will be described with reference to the accompanying drawings. The present invention may, however, be embodied in many different forms and should not be construed as limited to the embodiments set forth herein.

Throughout the specification, when a member or an element is referred to as being "connected" (connected, combined or coupled) with another member, it may be referred to as not only "directly connected" but also "indirectly connected". When a member "comprises" a certain element, it means that it can include other element unless specifically stated otherwise.

The terminology used herein is for the purpose of describing particular embodiments only and is not intended to be a limitation to the present invention. A singular form such as "a," "an," and "the" may include plural referents unless the context clearly dictates otherwise. In this specification, the terms "comprise", "including" or "having" and the like are intended to specify that there are stated features, numbers, steps, operations, elements, parts or combinations thereof. The use of the terms "comprise", "including" or "having" and the like do not preclude the presence or addition of one or more other features, numbers, steps, operations, components, parts, or combinations thereof.

The laser bonding apparatus for a three-dimensional structure according to the present invention is implemented to laser-bond an electronic component to a three-dimensional structure (e.g., an automotive taillight or a headlight) as shown in FIG. 1. The three-dimensional structure can be implemented as a mold manufactured by injection molding. In the past, bonding of three-dimensional structures was done by soldering, but the inventor(s) of the present application developed a laser bonding apparatus for a three-dimensional structure in order to reduce the manufacturing time as the paradigm of a manufacturing industry is being gradually changed to a new concept of a smart factory and customized mass production.

The laser bonding apparatus 200 for a three-dimensional structure according to an embodiment of the present invention comprises a three-dimensional structure providing unit for providing a plurality of three-dimensional structures applied with an adhesive material to which electronic components are to be attached, and a laser bonding unit for bonding the electronic components attached to the plurality of three-dimensional structures by irradiating a laser beam. According to this embodiment, the process of applying the adhesive material on the surface of the three-dimensional structure and attaching the electronic component device to the adhesive material can be performed by a separate apparatus. In this case, the three-dimensional structure providing unit of the laser bonding apparatus 200 for a plurality of three-dimensional structures according to the present invention will only perform the operation of transporting the plurality of three-dimensional structures to their bonding positions.

Figure 2:
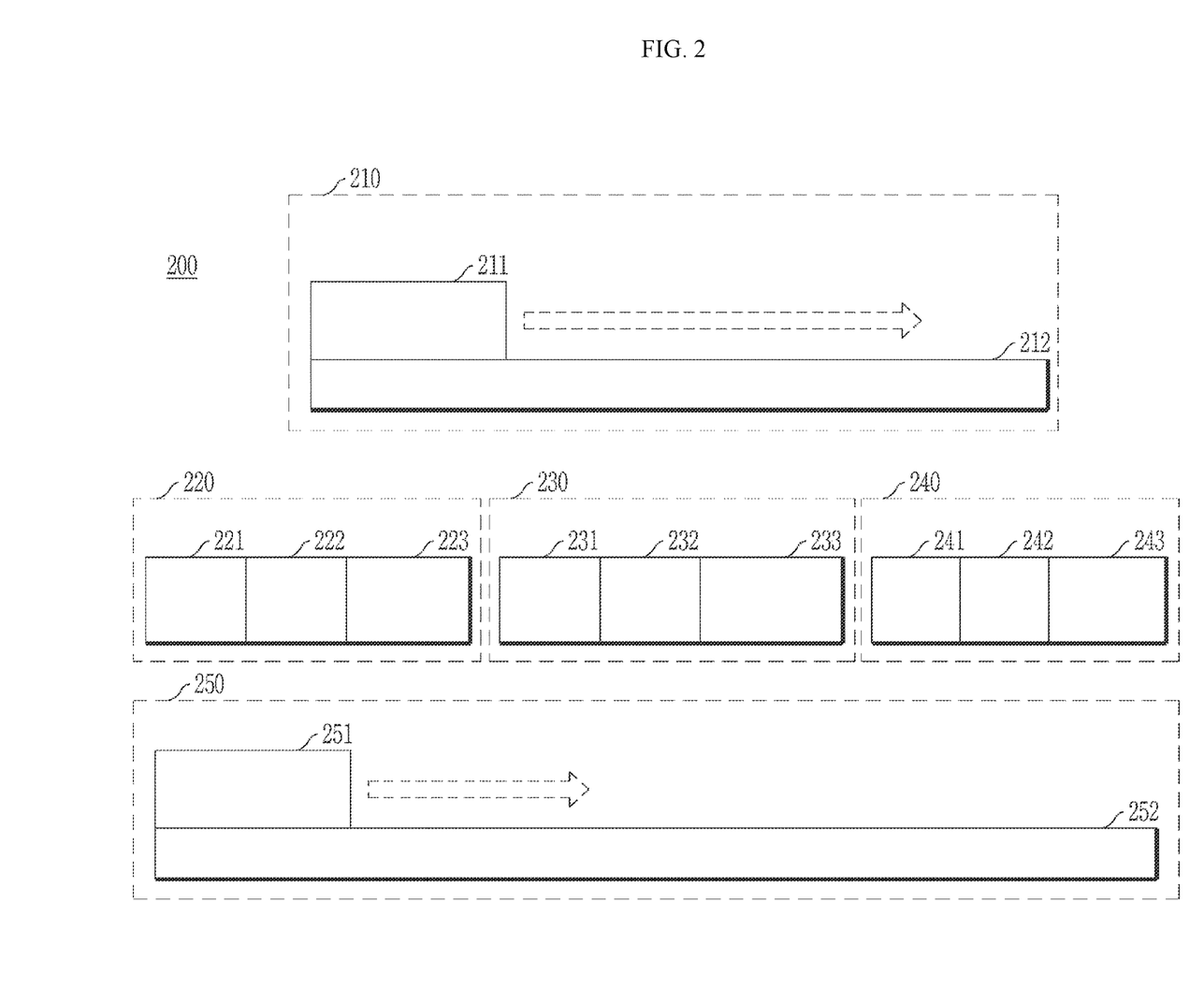
FIG. 2 is an exemplary view for explaining a laser bonding apparatus for a three-dimensional structure according to the present invention.

Referring to FIG. 2, the laser bonding apparatus 200 for a three-dimensional structure according to the present invention includes not only an electronic component providing unit 210 but also a three-dimensional structure providing unit 250, an adhesive material applying unit 220, an electronic component attaching unit 230, and a laser bonding unit 240.

The electronic component providing unit 210 mounts and transports a plurality of electronic components. The electronic component may include at least one of a semiconductor chip, an IC, an LED element, a resistor, a capacitor, an inductor, a transformer, a relay and so forth. The electronic component providing unit 210 includes a tray 211 on which a plurality of electronic components are mounted and a tray transporting unit 212 for transporting the tray 211 in a predetermined direction.

The three-dimensional structure providing unit 250 supports and conveys a plurality of three-dimensional structures in a predetermined direction. A plurality of three-dimensional structures may include a three-dimensional structure (for example, an automobile tail lamp or a headlight instrument) in which the bent portions have both a regular or irregular shape.

The three-dimensional structure providing unit 250 may be implemented to include a working table 251 for supporting a plurality of three-dimensional structures and a working table conveying unit 252 for conveying the working table on which the plurality of three-dimensional structures are mounted.

The adhesive material applying unit 220 applies, for example, solder paste or non-conductive adhesive (NCP) to the plurality of three-dimensional structures. Non-conductive adhesives, hereinafter referred to as "NCP", can be implemented, for example, with N-methyl-3-amino propyltrimethoxysilane as a coupling agent and polyester acrylate as an adhesion promoter.

The adhesive material applying unit 220 includes a dispenser 223 for applying solder paste or NCP to the plurality of three-dimensional structures placed on the working table 251, a first transfer unit 222 that transfers the dispenser 223 both vertically and horizontally within a plane perpendicular to the tray transporting direction, and a first gantry 221 that supports the first transfer unit 222.

The adhesive material applying unit 220 may be implemented by further including a first monitoring unit that detects an alignment state of the dispenser with respect to the three-dimensional structure and an application state of a solder paste or NCP. The first monitoring unit may include a CCD camera and a capture board for capturing an image, and a control unit for comparing the image input from the image processing board with the reference image to determine whether the alignment and application states are within normal ranges.

The electronic component attaching unit 230 attaches the electronic component to a portion of the three-dimensional structure to which solder paste or NCP is applied. The electronic component may include at least one of a semiconductor chip, an IC, an LED element, a resistor, a capacitor, an inductor, a transformer, or a relay.

The electronic component attaching unit 230 includes a component attach 233 for picking up an electronic component from the tray 211 and attaching it to a portion of a plurality of three-dimensional structure to which solder paste or NCP is applied. The electronic component attaching unit 230 further includes a second transfer unit 232 that transfers the component attach 233 both vertically and horizontally within a plane perpendicular to the tray transporting direction, and a second gantry 231 that supports the second transfer unit 232.

The electronic component attaching unit 230 may further include a second monitoring unit that detects an alignment state of the electronic component with respect to the three-dimensional structure and an attachment state of the electronic component to the three-dimensional structure. The second monitoring unit may include a CCD camera and a capture board for capturing an image, and a control unit for comparing the image input from the image processing board with the reference image to determine whether the alignment and attachment states are within normal ranges.

The laser bonding unit 240 irradiates laser beam of line or square type to the electronic component attached to the three-dimensional structure to bond them each other. An exemplary laser bonding unit 240 includes a laser beam irradiating unit 243, a third transfer unit 242 for moving the laser beam irradiating unit 243 vertically and horizontally within a plane perpendicular to the direction of tray transport, a third gantry 241 that supports the third transfer unit 242.

The laser beam irradiating unit 243 may include a laser oscillator that emits a laser beam to an electronic component attached to the three-dimensional structure, and a beam shaper and an optical system for converting a laser beam having Gaussian distribution outputted from the laser oscillator into square or rectangular surface beam having a uniform energy distribution.

The beam shaper may be embodied as a light guide forming a homogenized rectangular beam. The light guide may be installed to have a distance of 0.2 to 0.5 mm from the optical fiber that conveys the laser beam from the laser oscillator. The light guide may have a length between 1.0 to 1.5 meters. If the length of the light guide is less than 1.0 m, the optical homogeneity of the laser light outputted from the light guide after undergoing diffused reflection inside the light guide can be decreased thereby degrading the uniformity in the temperature distribution in the irradiation region of the workpiece (P). On the other hand, if the length of the light guide is set to be more than 1.5, the optical homogeneity of the laser beam becomes very good. However, the total length of the optical homogenization module including the beam shaper and optical system becomes too much long, which increases the manufacturing cost and inconvenience in storing and transporting the optical homogenization module.

No optical lens is required between the light guide and the optical fiber to make the laser beam uniform. Since the distance between the light guide and the optical fiber is between 0.2 and 0.5 mm and the numerical aperture (NA) of the optical fiber is within 0.2 to 0.3 range, all of the laser beam emitted from the optical fiber can be incident into the light guide.

The light guide is formed as a rectangular parallelepiped having a rectangular cross section using a base material having a high transmittance through which the laser light can pass. A total reflection coating film is formed on the sidewall parallel to the optical axis of the laser beam. An anti-reflective coating film is formed on both the upper and lower surfaces that are perpendicular to the optical axis. Thus, the laser beam passing through the light guide can be prevented from being lost outwardly.

The optical system can be realized, for example, by a condensing lens for condensing the divergent uniformized rectangular beam emitted from the light guide and a diverging lens for diverging the condensed uniformized rectangular beam while maintaining the uniformity of the beam up to a certain working distance. The combination of the radii of curvature of the condensing lens and the diverging lens allows the control of the size of the uniformized rectangular beam and the working distance.

The laser bonding unit 240 may include a third monitoring unit that detects an alignment state of the laser irradiating unit 243 with respect to the three-dimensional structure and a bonding state of the electronic component to the three-dimensional structure. The third monitoring unit may include a CCD camera and a capture board for capturing an image, and a control unit for comparing the image input from the image processing board with the reference image to determine whether the alignment and bonding states are within normal ranges.

The laser bonding unit 240 may be implemented to adjust the irradiation intensity and the irradiation region of the laser beam according to the shape of the three-dimensional structure as the working table 251 on which the plurality three-dimensional structures are placed is being moved. Accordingly, even when the shape of the substrate is three-dimensional or irregular, it is possible to irradiate a uniformized laser beam to each bonding site and easily adjust each irradiation region of the laser beam.

Figure 3:
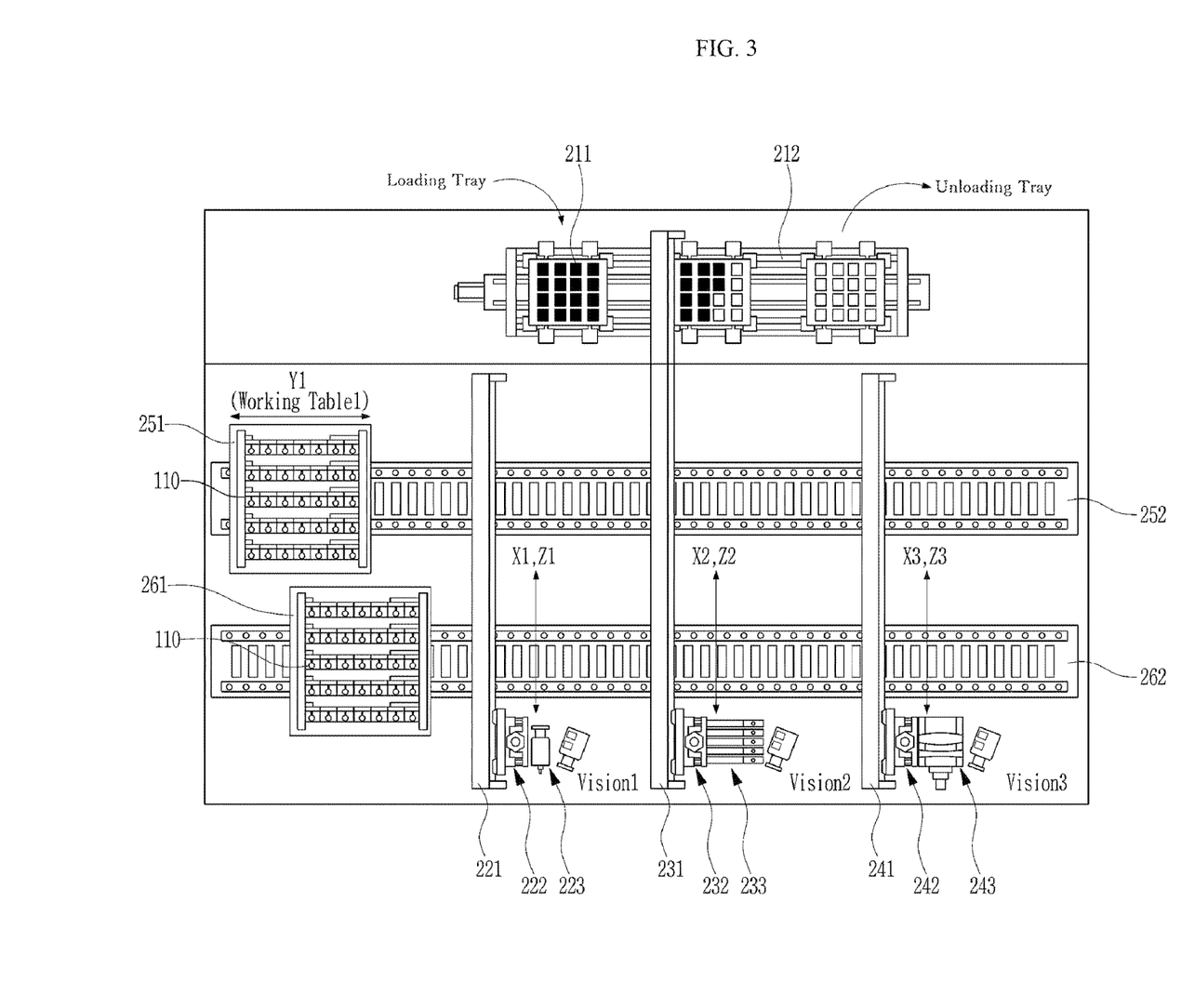
FIG. 3 is an exemplary view for explaining the operation of the laser bonding apparatus for a three-dimensional structure according to the present invention.
Figure 4:
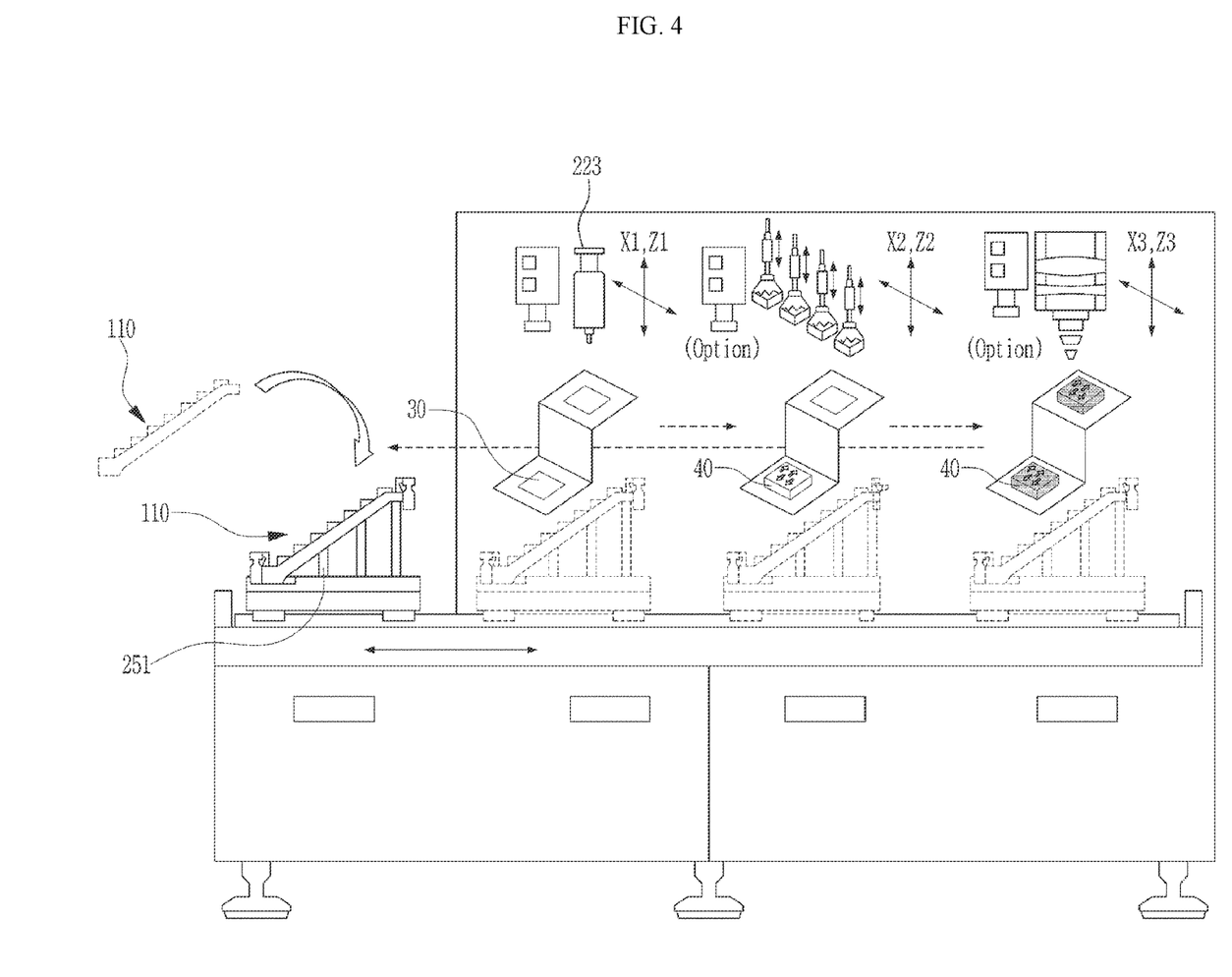
FIG. 4 is an exemplary view illustrating a process of bonding an electronic component to a three-dimensional structure using a laser bonding apparatus for a three-dimensional structure according to the present invention.

FIG. 3 is an exemplary view for explaining the operation of the laser bonding apparatus for a three-dimensional structure having a regular shape, and FIG. 4 is an exemplary view for explaining a process for bonding electronic components to the three-dimensional structure having a regular shape using the laser bonding apparatus in FIG. 3.

Referring to FIG. 3, the laser bonding apparatus for a three-dimensional structure having a regular shape includes first and second working tables 251 and 261 for respectively supporting a plurality of three-dimensional structures 110, and first and second working table conveying units 252 and 262 for conveying the first and second working tables 251 and 261, respectively. The number of working tables and working table conveying units can vary depending on the amount of required production of the device to be bonded.

The tray transporting unit 212 for transporting the tray 211 on which the plurality of electronic components are mounted can be installed separately from the first and second working table conveying units 252 and 262 as shown in FIG. 3. The tray 211 is loaded on the tray transporting unit 212 to be transported, and is discharged to the outside when used up.

The first and second working tables 251 and 261 are conveyed by the first and second working table conveying units 252 and 262 to pass the first gantry 221. The dispenser 223 for applying solder paste or NCP to the plurality of three-dimensional structures 110 and the first transfer unit 222 for transferring the dispenser 223 both vertically and horizontally within a plane perpendicular to the tray transporting direction are installed in the first gantry 221. A vision module for detecting an alignment state of the dispenser with respect to the three-dimensional structure and an application state of a solder paste or NCP may be further installed in the first gantry 221.

When the solder paste or NCP is applied to the plurality of three-dimensional structures, the first and second working tables 251, 261 are conveyed by the first and second working table conveying units 252, 262, respectively, to pass the second gantry 231. The component attach 233 and the second transfer unit 232 are installed in the second gantry 231. The component attach 233 is used for picking up an electronic component from the tray 211 and attaching it to a portion of the three-dimensional structure to which solder paste or NCP is applied, and the second transfer unit 232 is used for transferring the component attach 233 both vertically and horizontally within a plane perpendicular to the tray transporting direction. A vision module for detecting an alignment state of the component attach 233 with respect to the three-dimensional structure 110 and an attachment state of the electronic component to the three-dimensional structure 110 may be further installed in the second gantry 231.

When the electronic components are attached to the three-dimensional structures 110, the first and the second working tables 251, 261 are conveyed by the first and the second working table conveying units 252, 262 to pass the third gantry 241. The laser beam irradiating unit 243 and the third transfer unit 242 are installed in the third gantry 241. A vision module for detecting an alignment state of the laser beam irradiating unit 243 with respect to the three-dimensional structure 110 and an a laser bonding state of the electronic component to the three-dimensional structure 110 may be further installed in the third gantry 241.

Referring to FIG. 4, the three-dimensional structures 110 are mounted on the working table 251 to be conveyed by the working table conveying unit. In a sequential order, a solder paste or NCP 30 is applied by the dispenser 223 to the three-dimensional structures 110, the electronic component 40 is attached by the component attach 233 to the solder paste or the NCP 30, and the electronic component 40 is bonded by the laser beam irradiating unit 243 to the three-dimensional structure.

Heretofore, the apparatus and method for bonding electronic components to a plurality of three-dimensional structures having a regular shape using three-dimensional structure providing unit with regard to FIGS. 3 and 4.

Hereinafter, a three-dimensional structure providing unit for handling three-dimensional structures having irregular shape will be explained with reference to FIG. 5.

Figure 5:
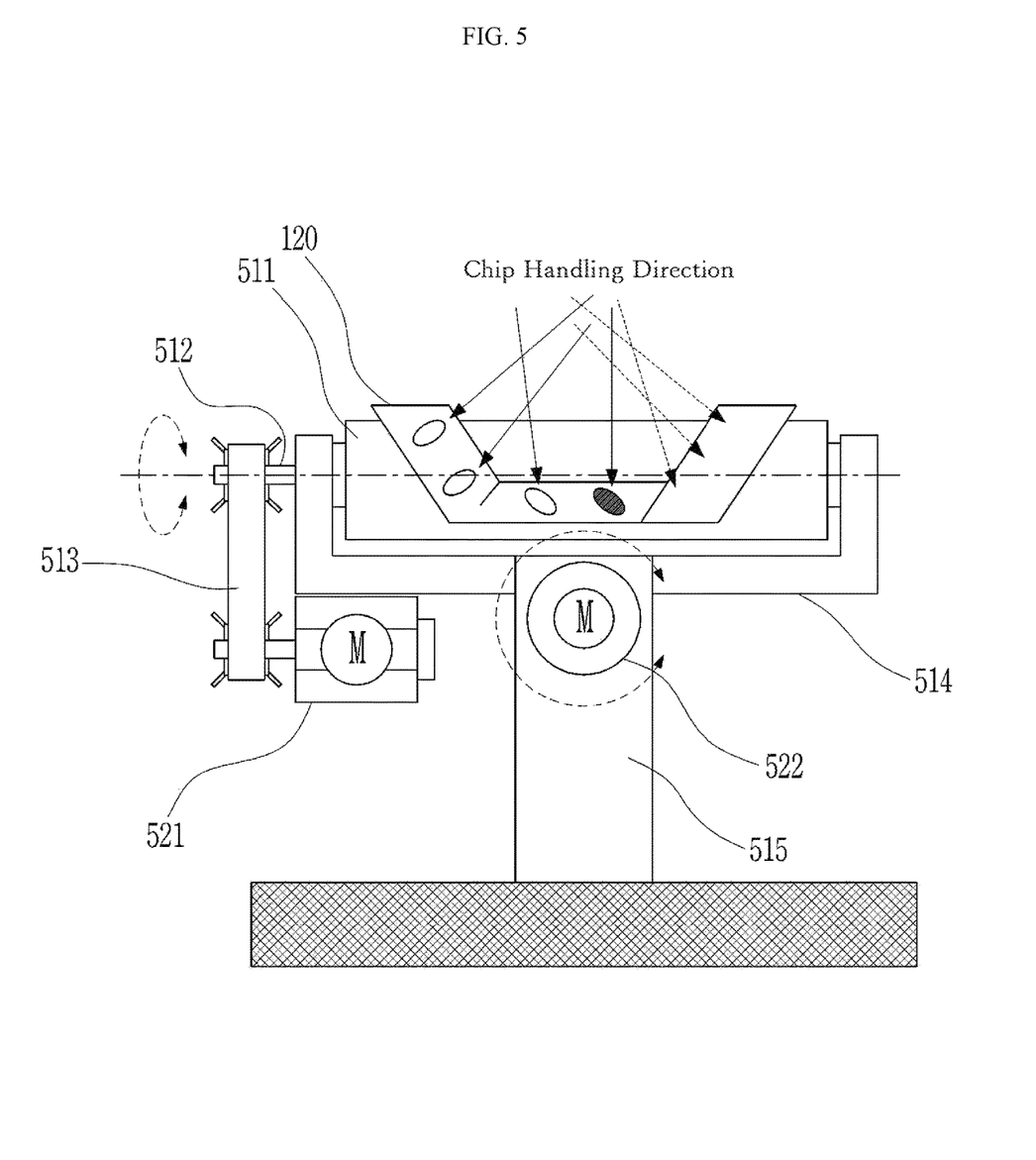
FIG. 5 is an exemplary view for explaining a three-dimensional structure providing unit used for providing a three-dimensional structure having an irregular shape.

Referring to FIG. 5, the three-dimensional structure providing unit includes a seat 511 on which a plurality of three-dimensional structures 120 having irregular shape are seated, a driving shaft 512 connected to the seat 511, a driving belt 513 connected to the driving shaft 512, a first motor 521 for rotating the driving belt 513, a coupler 514 coupled to the driving shaft 512, a support to which the coupler 514 is rotatably coupled, and a second motor 522 connected to the coupler 514 to rotate the coupler 514 with regard to its axis.

Although not shown in FIG. 5, the laser bonding apparatus for three-dimensional structure according to the present invention may be implemented to comprise a storage unit for storing operation file for driving the first and the second motors 521, 522 and motor driving unit for driving the first and second motors according to the operation file.

Figure 6:
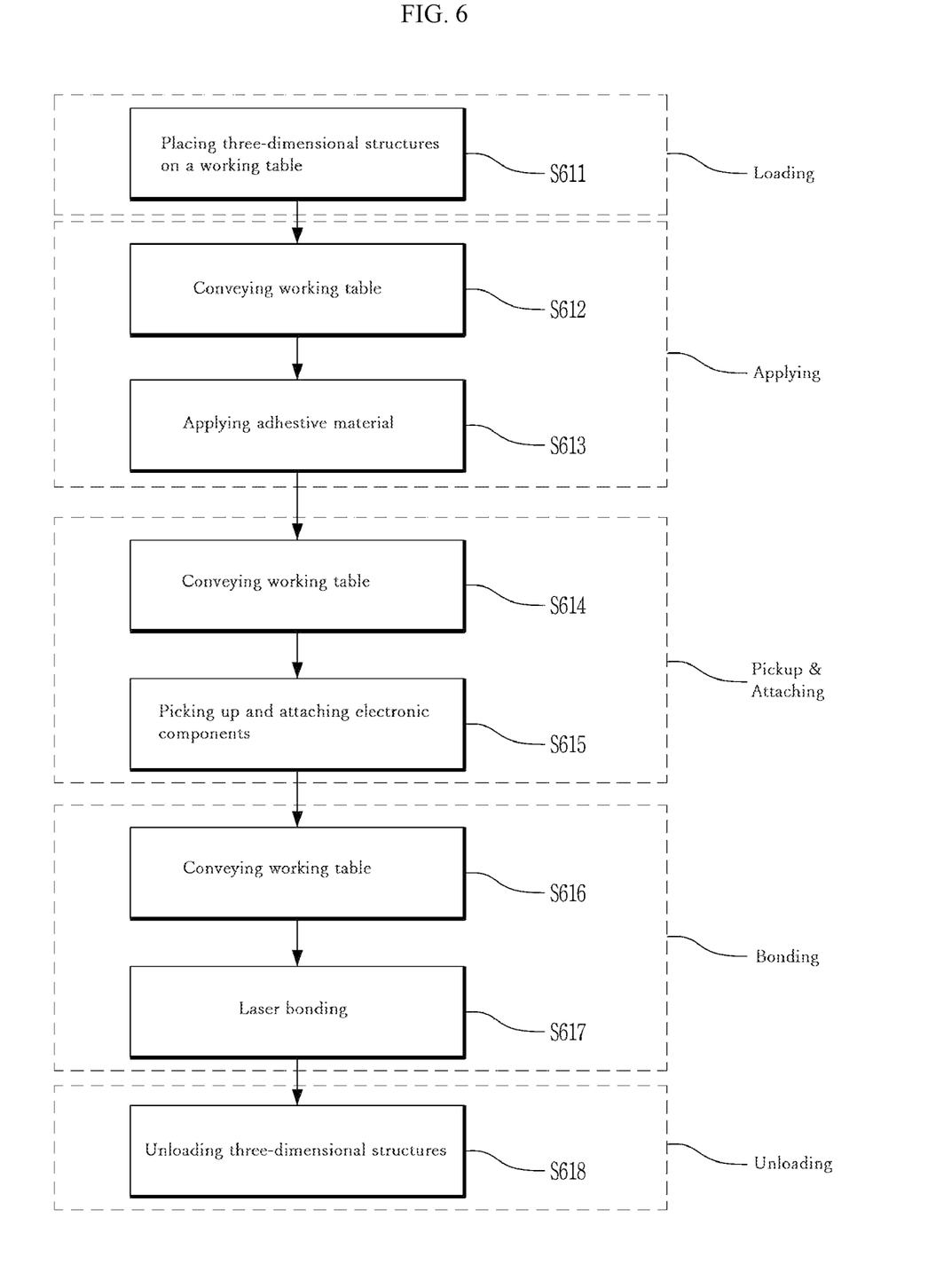
FIG. 6 is a flowchart illustrating a laser bonding method for a three-dimensional structure according to the present invention.

As shown in FIG. 6, the laser bonding method performed in the laser bonding apparatus for a three-dimensional structure according to FIGS. 3 and 4 includes a loading step, an applying step, a pickup and attach step, a bonding step, and an unloading step.

The loading step S611 includes the step of placing a plurality of three-dimensional structures on a working table. The applying step includes the step S612 of conveying the working table on which the plurality of three-dimensional structures are mounted by a working table conveying unit and a step S613 of applying solder paste or NCP to the three-dimensional structures. For example, the distance, speed and position of conveying the working table may be preset and stored in the storage unit of the laser bonding apparatus. However, a monitoring unit including a vision module may be used to check whether the working table has been exactly conveyed to the preset position and to correct the misalignment, if any. After the step S613, a step of detecting the state of application of the solder paste or NCP by a monitoring unit to determine whether the application state is within a normal range.

The picking-up and attaching step includes a step S614 of conveying the working table and a step S615 of picking up electronic components from the tray and attaching it to the three-dimensional structures. For example, the distance, speed and position of conveying the working table may be preset and stored in the storage unit of the laser bonding apparatus. However, a monitoring unit including a vision module may be used to check whether the working table has been exactly conveyed to the preset position and to correct the misalignment, if any. After the step S615, a step of detecting the state of attachment of the electronic component by a monitoring unit to determine whether the attachment state is within a normal range.

The bonding step includes the step S616 of conveying the working table and a step S617 of laser bonding the electronic component to the three-dimensional structures. For example, the distance, speed and position of conveying the working table may be preset and stored in the storage unit of the laser bonding apparatus. However, a monitoring unit including a vision module may be used to check whether the working table has been exactly conveyed to the preset position and to correct the misalignment, if any. After the step S617, a step of detecting the bonding state of the electronic component by a monitoring unit to determine whether the bonding state is within a normal range.

The unloading step S618 unloads the three-dimensional structures from the working table after the bonding of the electronic components to the three-dimensional structures.

It will be understood by those having ordinary skill in the art that various changes and modifications may be made without departing from the spirit and scope of the present invention as defined by the following claims.

For example, each element or step in the above-explained embodiments may be implemented by a plurality of distributed or separated elements or steps.

At the same time, the elements or step described to be distributed or separated in the above-explained embodiments may be implemented in a connected, coupled or combined form

NUMBERS IN THE DRAWINGS

30: solder paste or non-conductive adhesive (NCP)
40: electronic component
110: three-dimensional structure
200: laser bonding device for three-dimensional structures
210: electronic component providing unit
211: tray
212: tray transporting unit
211: tray
212: tray transporting unit
220: adhesive material applying unit
221: a first gantry
222: a first transfer unit
223: dispenser
230: electronic component attaching unit
231: a second gantry
232: a second transfer unit
233: component attach
240: laser bonding unit
241: a third gantry
242: a third transfer unit
243: laser beam irradiating unit
251: a first working table
252: a first working table conveying unit
261: a second working table
262: second working table conveying unit

BEST MODE

Heretofore, the embodiments were explained in their best modes.

INDUSTRIAL APPLICABILITY

The disclosed techniques could be used in an apparatus for laser bonding.

What is claimed is:

1. A laser bonding method for a three-dimensional structure comprising:
transporting, by an electronic component providing unit, a plurality of electronic components;
providing, by a three-dimensional structure providing unit, a plurality of three-dimensional structures on a working table;
conveying, by a working table conveying unit, the working table on which the plurality of three-dimensional structures are mounted;
applying, by an adhesive material applying unit, adhesive material to one of the three-dimensional structures;
attaching, by an electronic component attaching unit, an electronic component among the transported electronic components to the one of three-dimensional structures on which the adhesive material is applied; and
laser bonding, by a laser bonding unit, the attached electronic component to the one of three-dimensional structures by irradiating a laser beam to the electronic component attached to the one of three-dimensional structures,
wherein the transporting of the plurality of electronic components includes:

mounting the plurality of electronic components on a tray; and transporting the tray in a predetermined direction.

2. The laser bonding method according to claim 1, wherein the applying of the adhesive material comprises:

applying, by a dispenser, solder paste or NCP to the one of three-dimensional structures mounted on the working table; and transferring, by a first transfer unit, the dispenser vertically and horizontally within a plane perpendicular to a tray transporting direction.

3. The laser bonding method according to claim 2, wherein the applying of the adhesive material further comprises:

detecting, by a first monitoring unit, the alignment state of the dispenser with respect to the three-dimensional structures and application state of the solder paste or NCP to the three-dimension structures.

4. A laser bonding method for a three-dimensional structure comprising:

mounting a plurality of three-dimensional structures to a working table;

conveying, by a working table conveying unit, the working table on which the three-dimensional structures are mounted;

applying, by an adhesive material applying unit, adhesive material to one of the three-dimensional structures;

picking up and attaching, by an electronic component attaching unit, an electronic component to the one of three-dimensional structures on which the adhesive material is applied; and bonding, by a laser bonding unit, the electronic component to the one of three-dimensional structures by irradiating a laser beam to the electronic component attached to the three-dimensional structure.

5. The laser bonding method according to claim 4, wherein the adhesive material is solder paste or NCP.

6. The laser bonding method according to claim 4, wherein the plurality of three-dimensional structures is a structure for an automobile tail lamp or an automobile headlamp.

* * * * *